United States Patent
Wang et al.

(10) Patent No.: US 8,402,340 B2
(45) Date of Patent: Mar. 19, 2013

(54) PARITY-CHECK-CODE DECODER AND RECORDING CONTROLLER

(75) Inventors: Cheng-Kang Wang, Taichung (TW); Chia-Chun Hung, Taipei County (TW)

(73) Assignee: Realtek Semiconductor Corp., Hsinchu (TW)

( * ) Notice: Subject to any disclaimer, the term of this patent is extended or adjusted under 35 U.S.C. 154(b) by 603 days.

(21) Appl. No.: 12/617,212

(22) Filed: Nov. 12, 2009

(65) Prior Publication Data
US 2010/0125769 A1    May 20, 2010

(30) Foreign Application Priority Data
Nov. 14, 2008 (TW) ................................ 97144129 A

(51) Int. Cl.
*H03M 13/00* (2006.01)
(52) U.S. Cl. ........ 714/758; 714/799; 714/800; 714/801; 714/804
(58) Field of Classification Search .................. 714/758, 714/799, 800, 801, 804
See application file for complete search history.

(56) References Cited

U.S. PATENT DOCUMENTS

| | | | | |
|---|---|---|---|---|
| 7,165,205 B2 * | 1/2007 | Blankenship et al. | ........ | 714/752 |
| 7,343,548 B2 * | 3/2008 | Blankenship et al. | ........ | 714/800 |
| 8,140,930 B1 * | 3/2012 | Maru | ............................ | 714/752 |
| 2010/0122139 A1 * | 5/2010 | Wang et al. | .................... | 714/752 |
| 2012/0054577 A1 * | 3/2012 | Kim | ............................... | 714/755 |

FOREIGN PATENT DOCUMENTS

CN            1852029 A         10/2006

\* cited by examiner

*Primary Examiner* — Charles Ehne
(74) *Attorney, Agent, or Firm* — Ladas & Parry LLP

(57) ABSTRACT

A parity-check-code decoder includes: a verifying device that multiplies (N) bit nodes by a matrix provided with (N) columns so as to obtain a plurality of check nodes; a reliability generator that generates a reliability index for each of the bit nodes in accordance with a channel; a reliability-updating device that uses the bit nodes and the check nodes to exchange message iteratively, and following each iteration, updates (N) exchange results corresponding to the (N) columns; and a recording controller that includes a separator, a quantizing determiner and a quantizer. The separator divides the matrix into at least one column group based on the characterizing signals. The quantizing determiner determines a shift signal for each column group based on the characterizing signals. The quantizer quantizes the characterizing signals according to the shift signals for subsequent output.

18 Claims, 4 Drawing Sheets

PARITY-CHECK-CODE DECODER AND RECORDING CONTROLLER

CROSS-REFERENCE TO RELATED APPLICATION

This application claims priority of Taiwanese application no. 097144129, filed on Nov. 14, 2008.

BACKGROUND OF THE INVENTION

1. Field of the Invention

The invention relates to a recording technique, more particularly to a recording technique for a parity-check-code decoder.

2. Description of the Related Art

Low-density parity-check (LDPC) code is an error correction code. Since LDPC code allows data transmission rates approaching the Shannon Limit, use of LDPC code is increasingly incorporated in communications standards such as Digital Video Broadcast-Satellite Version 2 (DVB-S2), Digital Terrestrial Multimedia Broadcasting (DTMB), and IEEE 802.11. At a signal-receiving end, a LDPC code decoder receives through a channel (N) bits that are to be decoded, and treats each of the bits as a bit node. In order to decode correctly the (N) bits, the (N) bit nodes must satisfy (N–K) conditions, wherein the conditions are called check nodes. Assuming that the check nodes are zeroes, the LDPC code decoder uses the bit nodes and the check nodes to exchange iteratively probabilities of the bit nodes being '0' or '1'.

Many LDPC code decoders use log-likelihood ratio (LLR), in which the probability of the bit node being '0' is divided by the probability of the bit node being '1', to represent reliability. As the number of iterations increases, the probability of the bit node being a specific value (that is, '1' or '0') becomes higher, and thereby an absolute value of the reliability value increases accordingly. In an actual circuit, however, only a limited bit length can be used for recording the reliability value. Consequently, the issue remains as to how to record large reliability values. In PROC Patent Application Number 200610012000.9, there is disclosed a method of recording reliability according to the number of iterations. However, since the number of iterations is predetermined, the method may not be suited to actual operating conditions.

SUMMARY OF THE INVENTION

Therefore, the main object of the present invention is to provide a parity-check-code decoder capable of dynamically adjusting bit lengths for recording reliability values in accordance with magnitudes of the reliability values so as to lower cost of circuit implementation.

According to one aspect of the present invention, there is provided a parity-check-code decoder adapted for receiving through a channel at least (N) bits that are to be decoded. Each of the (N) bits is encoded through parity-check coding, and the parity-check-code decoder treats each of the bits as a bit node. The parity-check-code decoder comprises a verifying device, a reliability generator, a reliability-updating device, and a recording controller. The verifying device is for multiplying the (N) bit nodes by a parity-check-code matrix provided with (N) columns so as to obtain a plurality of check nodes. The reliability generator is for generating a reliability index for each of the bit nodes in accordance with the channel. The reliability-updating device is coupled to the verifying device and the reliability generator for using the bit nodes and the check nodes to exchange messages iteratively based on the reliability indices, and following each iteration, updating (N) exchange results corresponding to the (N) columns, respectively. The recording controller is coupled to the reliability-updating device, and includes a separator, a quantizing determiner, and a quantizer. The separator is for dividing the parity-check-code matrix into (G) column groups according to column weights of the (N) columns, wherein $G \geqq 1$, and outputting (N) characterizing signals corresponding to the exchange results, respectively, based on the column weights of each of the column groups. The column weights of the columns belonging to a same column group have a same value, and the characterizing signals of the same column group are expressed using a same bit length. The quantizing determiner is coupled to the separator for determining a shift signal for each of the column groups according to the characterizing signals. The quantizer is coupled to the quantizing determiner for quantizing the characterizing signals according to the shift signals for subsequent output.

According to another aspect of the present invention, there is provided a recording controller adapted for receiving at least (N) signals that are to be recorded, and for performing control based on a matrix provided with (N) columns. The signals comprise exchange results. The recording controller comprises a separator, a quantizing determiner, and a quantizer. The separator is for dividing the matrix into (G) column groups according to column weights of the (N) columns, wherein $G \geqq 1$, and outputting (N) characterizing signals corresponding to the exchange results, respectively, based on the column weights of each of the column groups. The column weights of the columns belonging to a same column group have a same value, and the characterizing signals of the same column group are expressed using a same bit length. The quantizing determiner is coupled to the separator for determining a shift signal for each of the column groups according to the characterizing signals. The quantizer is coupled to the quantizing determiner for quantizing the characterizing signals according to the shift signals for subsequent writing to a memory.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
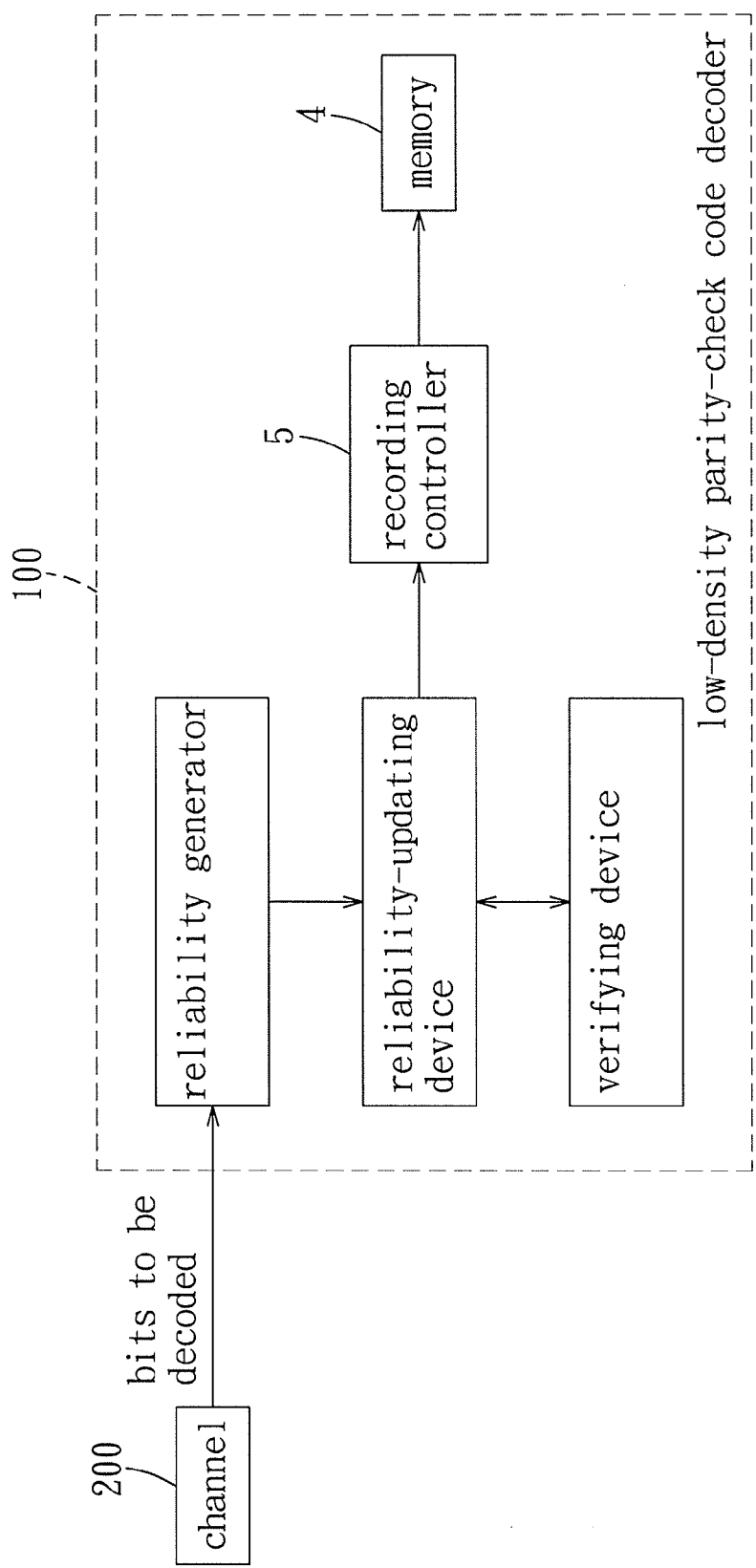
FIG. 1 is a schematic circuit block diagram of a preferred embodiment of a parity-check-code decoder according to the present invention.

FIG. 1 illustrates the preferred embodiment of a parity-check-code decoder 100 according to the present invention. The parity-check-code decoder 100 is adapted for receiving through a channel 200 at least (N) bits that are to be decoded, each of the (N) bits being encoded through parity-check coding. The parity-check-code decoder 100 treats each of the bits as a bit node, and includes a verifying device 3, a reliability generator 1, a reliability-updating device 2, a memory 4 and a recording controller 5. In this embodiment, the parity-checkcode decoder 100 is a low-density parity-check (LDPC) code decoder, and each of the bits that are to be decoded was encoded through LDPC coding.

The verifying device 3 multiplies the (N) bit nodes $B_0, B_1, B_2 \ldots B_{N-1}$ by a parity-check-code matrix, which in this embodiment is a LDPC code matrix (hereafter referred to as 'the matrix'), having a size (N−K)×(N) (that is, (N−K) rows and N columns) so as to obtain (N−K) check nodes $C_0, C_1, C_2 \ldots C_{N-K-1}$, wherein (N−K)>0. Assuming that an element of row (m+1) and column (n+1) of the matrix is 1, then the check node $C_m$ can exchange messages with the bit node $B_n$, and the same check node $C_m$ can exchange messages with at least two of the bit nodes, wherein m=0, 1, 2 ... (N−K−1) and n=0, 1, 2 ... (N−1).

The reliability generator 1 generates a reliability index $Q_n$ for each of the bit nodes $B_n$ in accordance with a quality of the channel 200. The reliability-updating device 2 is coupled to the verifying device 3 and the reliability generator 1 for using the bit nodes $B_n$ and the check nodes $C_m$ to exchange messages iteratively based on the reliability indices $Q_n$, and following each iteration, updating (N) exchange results corresponding to the (N) columns, respectively. In this embodiment, the exchange results that are updated following each iteration are the reliability indices $Q_n$ and a plurality of check indices $Q_{mn}$. The verifying device 3, after updating the bit nodes $B_n$ in accordance with the reliability indices $Q_n$, then multiplies the updated bit nodes $B_1 \sim B_{N-1}$ by the matrix to obtain the updated check nodes $C_0 \sim C_{N-K-1}$, and determines whether to perform another iteration accordingly. The recording controller can then write a plurality of signals to be recorded to the memory 4. In this embodiment, the signals to be recorded are the updated reliability indices $Q_n$.

The exchange results (i.e., the reliability indices $Q_n$ and the check indices $Q_{mn}$) are defined as follows. The reliability index $Q_n$ is defined as a log-likelihood ratio (LLR) of value probabilities of the bit node $B_n$ (that is, the ratio of the probability of the bit node $B_n$ being '1' and the probability of the bit node $B_n$ being '0'). The check index $Q_{mn}$ is defined as the LLR of the value probabilities of the bit node $B_n$, assuming that values of all the check nodes $C_m$, except for the check nodes $C_m$ capable of exchanging messages with the bit node $B_n$ are zero. As such, when the probability of the bit node $B_n$ being '0' is high, the reliability indices $Q_n$ and the check indices $Q_{mn}$ are greater than zero. Otherwise, the reliability indices $Q_n$ and the check indices $Q_{mn}$ are not larger than zero. As the number of iterations increases, the probability of the bit node $B_n$ being a specific value ('1' or '0') increases, and accordingly, absolute values of the reliability indices $Q_n$ and the check indices $Q_{mn}$ increase. At this time, if the recording controller 5 records the exchange results without performing any special processing beforehand, limited space in the memory 4 is bound to be insufficient.

Figure 2:
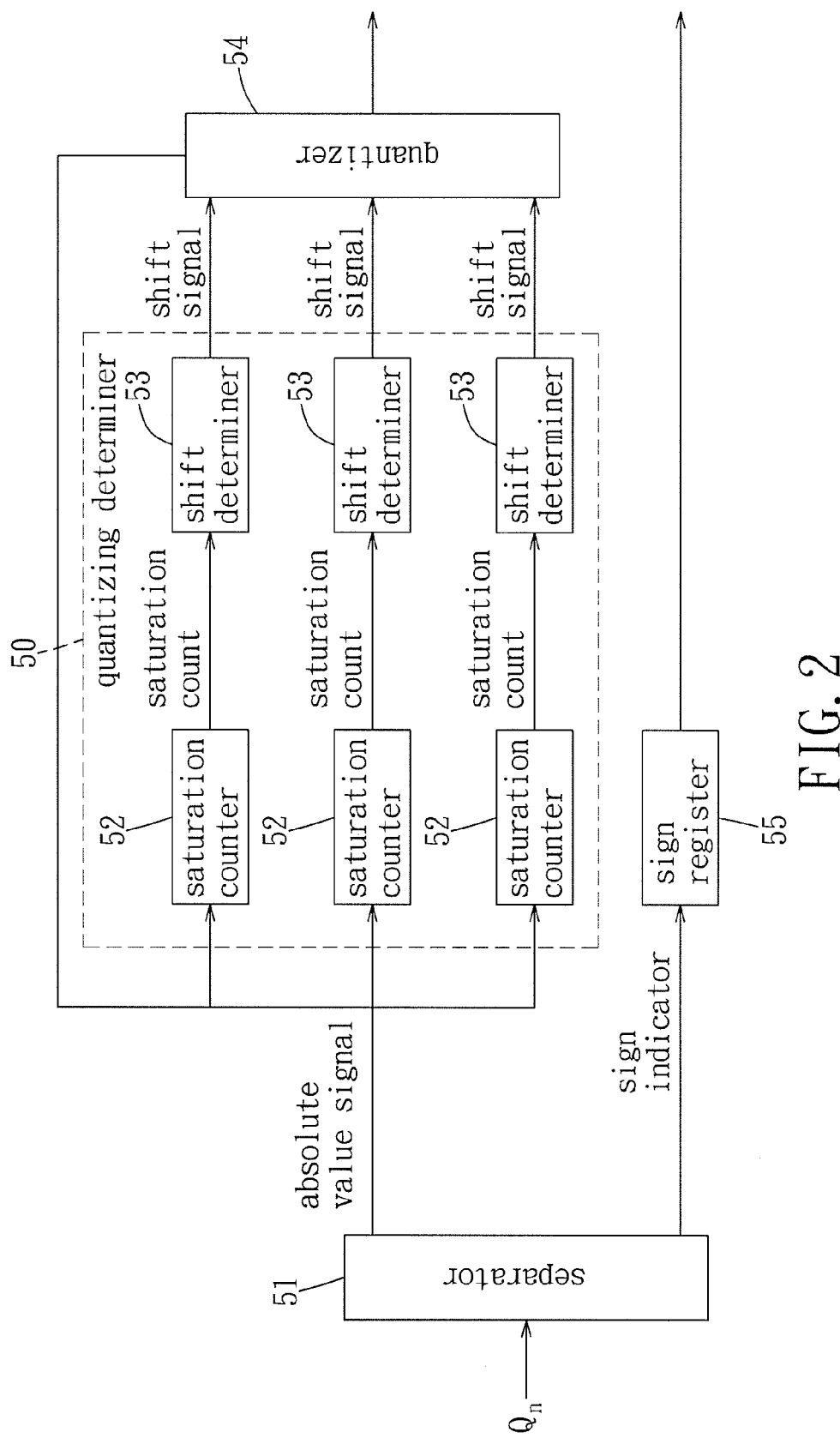
FIG. 2 is a schematic circuit block diagram of a recording controller of the preferred embodiment.

With further reference to FIG. 2, the recording controller 5 is coupled to the reliability-updating device 2 and includes a separator 51, a quantizing determiner 50 coupled to the separator 51, and a quantizer 54 coupled to the quantizing determiner 50. The separator 51 outputs (N) characterizing signals corresponding to the updated reliability indices $Q_n$, respectively. The quantizing determiner 50 determines a plurality of shift signals according to whether the characterizing signals reach saturation. The quantizer 54 quantizes the characterizing signals according to the shift signals (that is, divides using values of the shift signals) for subsequent writing to the memory 4. Thus, through the quantization procedure, the bit length needed for recording is reduced.

Based on the size of the matrix used by the verifying device 3, it can be inferred that the matrix has (N−K)×(N) entries (the value of each entry being either '0' or '1'). Usually, a sum of all non-zero elements in one of the rows serves as the row weight of the row, and a sum of all non-zero elements in one of the columns serves as the column weight of the column. If all row weights are equal and all column weights are equal, the matrix is considered to be a regular matrix; otherwise, the matrix is considered to be an irregular matrix. For convenience, in the illustration below, the matrix is presumed to be an irregular matrix.

The separator 51 divides the matrix into (G) column groups according to column weights of the (N) columns, wherein G≧1, and outputs (N) characterizing signals corresponding to the updated reliability indices $Q_n$, respectively, based on the column weights of each of the column groups, wherein the column weights of the columns belonging to a same column group have a same value, and the characterizing signals of the same column group are expressed using a same bit length. The bit length is increased in accordance with increases in the column weight for reasons as follows.

When the column weight of the column (n+1) increases, the number of the check nodes $C_m$ capable of exchanging messages with the bit node $B_n$ increases, and consequently, the absolute value of the reliability index $Q_n$ increases rapidly. As such, the separator 51 assigns a longer bit length for expressing the characterizing signal corresponding to the column with an increased column weight so as to prevent the characterizing signal from reaching saturation too quickly. For example, suppose that the separator 51 divides the matrix into G=3 column groups (that is, a first column group, a second column group and a third column group), and the column weights of each of the column groups are 3, 4 and 11, respectively. Then, the separator 51 assigns a bit length (A=6) for expressing the characterizing signals belonging to the first column group, a bit length (B=7) for expressing the characterizing signals belonging to the second column group, and a bit length (C=9) for expressing the characterizing signals belonging to the third column group.

Since the recording controller 5 uses a same manner for recording the updated reliability indices $Q_n$ of each of the column groups, only recording of the updated reliability indices $Q_n$ of the first column group is illustrated herein for the sake of brevity. After assigning the bit length (A=6) for expressing the characterizing signals belonging to the first column group, the separator 51 then separates each of the characterizing signals into a sign indicator (1 bit) for indicating a sign and an absolute value signal (5 bits) for indicating an absolute value. If the absolute value of the characterizing signal is not less than $(2^5-1)$, an absolute value signal having a value equal to 11111 is outputted. If the absolute value of the characterizing signal is less than $(2^5-1)$, an equivalent value having a bit length of 5 is outputted as the absolute value signal. For example, if the characterizing signal has a value of '18', the absolute value signal has the value of '10010'.

The quantizing determiner 50 determines the shift signal having a form of 2 raised by a power for each of the column groups in accordance with the absolute value signals of each of the column groups. The quantizing determiner 50 includes three saturation counters 52, each corresponding to a respective one of the column groups (G=3), and three shift determiners 53 coupled to the saturation counters 52. The saturation counter 52 corresponding to the first column group determines whether the absolute value signals belonging to the first column group reach saturation and outputs a saturation count accordingly, which represents the number of the reliability indices $Q_n$ of the first column group that reach saturation following each iteration. Then, the shift determiner 53 corresponding to the first column group determines the shift signal in accordance with the saturation count. The quantizer 54 then quantizes the absolute value signals belonging to the first column group according to the shift signal (that is, divides by the value of the shift signal) for subsequent writing to the memory 4. In such a manner, the quantizer 54 updates content of the memory 4 following each iteration. In this embodiment, the recording controller 5 further comprises a sign register 55 for registering each sign indicator so as to provide identification of the signs in the content of the memory 4. However, in another embodiment, the sign register 55 can be omitted, and the sign indicators can be written directly to the memory 4.

Figure 3:
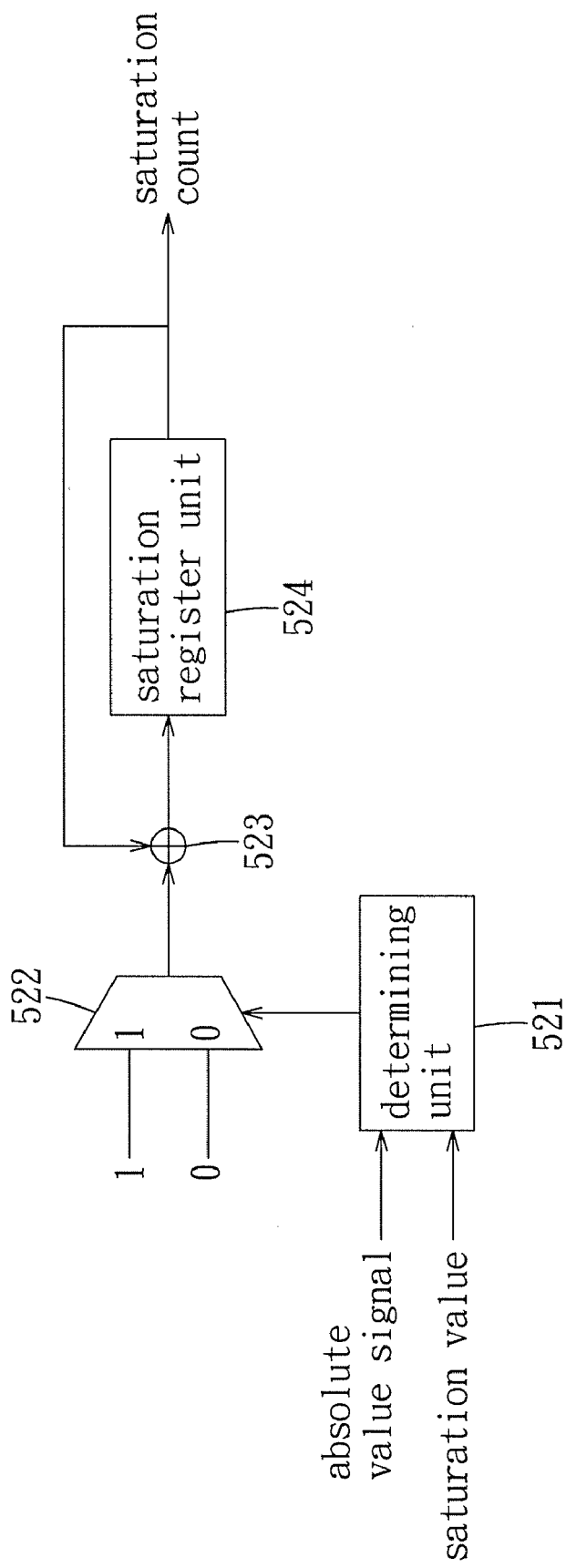
FIG. 3 is a schematic circuit block diagram of a saturation counter of the preferred embodiment.
Figure 4:
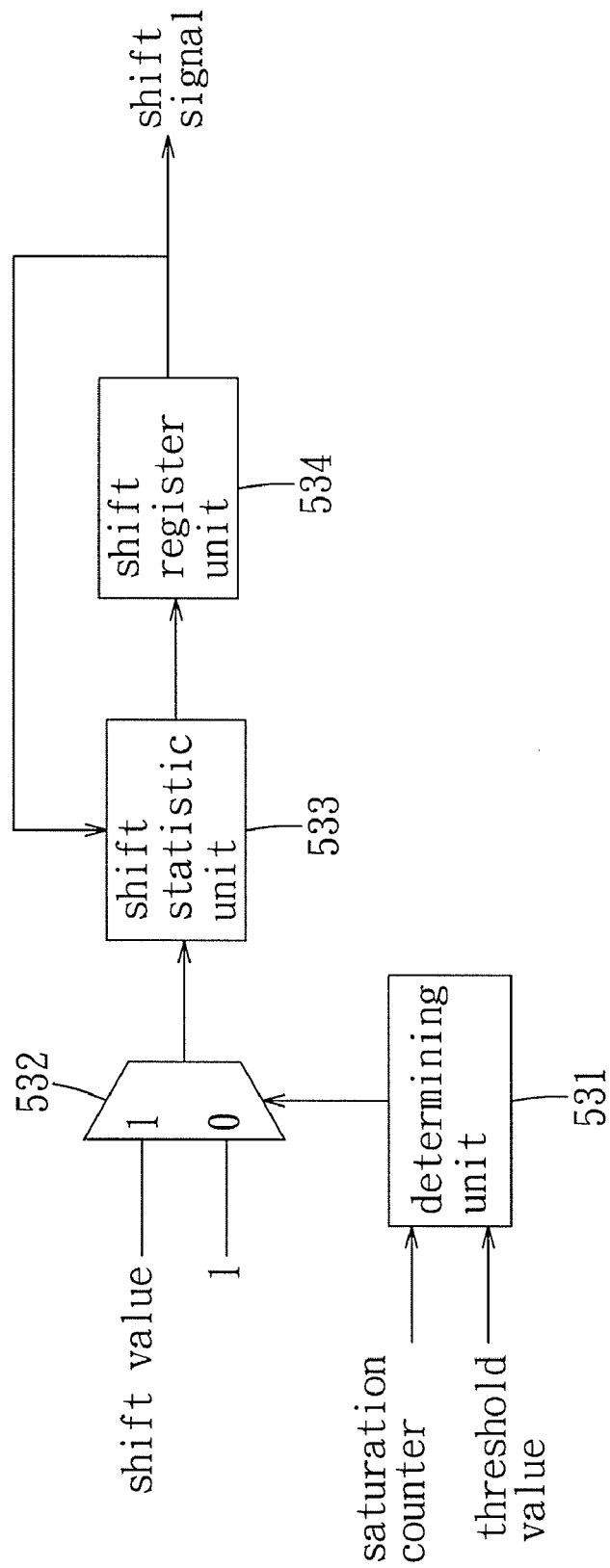
FIG. 4 is a schematic circuit block diagram of a shift determiner of the preferred embodiment.

Referring to FIGS. 3 and 4, each of the saturation counters 52 includes a saturation register unit 524, a determining unit 521, a multiplexing unit 522 coupled to the determining unit 521, and an adder unit 523 coupled to the multiplexing unit 522 and the saturation register unit 524. The saturation register unit 524 resets the saturation count to zero following each update of the reliability indices $Q_n$ by the reliability-updating device 2. Each of the shift determiners 53 includes a shift register unit 534, a determining unit 531, a multiplexing unit 532 coupled to the determining unit 531, and a shift statistic unit 533 coupled to the multiplexing unit 532 and the shift register unit 534. The shift register unit 534 resets the shift signal to a predetermined value in accordance with generation of the reliability indices $Q_n$ by the reliability generator 1.

Taking the first column group as an example, after the saturation register unit 524 resets the saturation count to zero, the determining unit 521 corresponding to the first column group then determines whether each of the absolute value signals belonging to the first column group equals a saturation value, which in this case is '11111'. If the absolute value signal equals the saturation value, the multiplexing unit 522 outputs the specific value of '1'. Otherwise, the multiplexing unit 522 outputs a specific value of '0'. Then the adder unit 523 adds the specific value to a previous saturation count of the saturation register unit 524 and provides an addition result to the saturation register unit 524 for subsequent output of an updated saturation count. Then, the determining unit 521 proceeds to determine whether a next one of the absolute value signals belonging to the first column group reaches saturation, until it has been determined whether each of the absolute value signals belonging to the first column group has reached saturation.

Next, the determining unit 531 of the shift determiner 53 determines whether the saturation count is greater than a threshold value, and the multiplexing unit 532 then outputs an accumulation signal according to a determination result of the determining unit 531. When the determining unit 531 determines that the saturation count is greater than the threshold value, the multiplexing unit 532 selects a shift value as the accumulation signal. When the determining unit 531 determines that the saturation count is not greater than the threshold value, the multiplexing unit 532 selects '1' as the accumulation signal. After the first iteration, the shift statistic unit 533 multiplies the value of the accumulation signal by the predetermined value of the shift signal for subsequent output. For the subsequent iteration, the shift statistic unit 533 multiplies the value of the accumulation signal by a value of the shift signal obtained following the previous iteration. The shift statistic unit 533 provides the multiplication result to the shift register unit 534 for subsequent output of an updated shift signal.

The example below is for illustrating operation of the shift determiner 53 assuming that the predetermined value of the shift signal is '$2^{-2}$'. Following the first iteration, if the determining unit 531 determines that the saturation count is greater than the threshold value, the multiplexing unit 532 selects the shift value of '$2^2$' as the accumulation signal. The shift statistic unit 533 then multiplies the value of the accumulation signal by the predetermined value of the shift signal, which in this case is '$2^{-2}$', and the shift register unit 534 then updates the value of the shift signal to '1'. The quantizer 54 is then able to write the absolute value signals directly into the memory 4.

Following the second iteration, if the determining unit 531 again determines that the saturation count is greater than the threshold value, the multiplexing unit 532 selects the shift value of '$2^2$' as the accumulation signal, and the shift statistic unit 533 then multiplies the shift value by the value of the shift signal obtained following the first iteration, which in this case is '1', and provides the multiplication result to the shift register unit 534. The shift register unit 534 then updates the shift signal to '$2^2$'. Then the quantizer 54 divides the absolute value signals by the updated shift signal, which is '$2^2$', before subsequently writing to the memory 4.

It is worth noting that, though this embodiment uses the irregular matrix having three column groups, in practice, the number of column groups is not limited to three, and a regular matrix can be treated as a special case in that the matrix has only one column group. Moreover, though in this embodiment the separator 51 separates each of the characterizing signals into the sign indicator and the absolute value signal before writing to the memory 4, in another embodiment, performance of such separation by the separator 51 can be omitted, and the characterizing signals can be written directly to the memory 4 in a manner indicating the signs. For instance, when the characterizing signal is '−1', '11111' can be written. When the characterizing signal is '1', '00001' can be written.

Moreover, in this embodiment, each of the shift signals generated by the shift determiners 53 has a form of '2' raised by a power (for example: $2^x$), and the quantizers 54 divide the absolute value signals belonging to the same column group by the corresponding shift signal before writing to the memory 4. However, in other applications, each of the shift signals may take a form of number raised to a power (such as: X), and the quantizer 54 divides the absolute value signals by '$2^x$', wherein 'x' equals the value of the corresponding shift signal.

It is further worth noting that, in regard to the shift determiners 53, the threshold values selected for use by the determining units 531 do not need to be equal to one another, and likewise, the shift values selected for use by the multiplexing units 532 can be different from one another, and can be adjusted according to the column weights of the corresponding column groups.

Similarly, it is not necessary to restrict the shift register units 534 to having the shift signals with a same predetermined value. Instead, different predetermined values can be set based on the quality of the channel 200, such that the better the quality of the channel 200, the greater the predetermined value that is set for the shift signal. The reasoning for the above is that the better the quality of the channel 200, the less interference from the channel 200 the bit node $B_n$ receives, and thereby accordingly, the probability of the bit node $B_n$ being a specific value is higher.

Moreover, in this embodiment, recording is performed in accordance with each iteration performed by the reliability-updating device 2 for updating the reliability indices $Q_n$. However, recording can be performed based on generation of the reliability indices $Q_n$ by the reliability generator 1. In another embodiment, recording can be performed based on generation of the check indexes $Q_{mn}$ following each iteration.

In addition, although in this embodiment, the memory 4 of the parity-check-code decoder 100 is a built-in memory, in practice, the memory 4 can be an external memory. Furthermore, the recording controller 5 can be implemented independent of the parity-check-code decoder 100.

In sum, the parity-check-code decoder 100 of this invention determines the shift signal according to the saturation count following each iteration, and divides the absolute value signals by the shift signal before writing to the memory 4, so that the bit length needed for recording is effectively reduced, thereby reducing cost of circuit implementation.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A parity-check code-decoder adapted for receiving through a channel at least (N) bits that are to be decoded, each of the (N) bits being encoded through parity-check coding, said parity-check-code decoder treating each of the bits as a bit node, and comprising:
    a verifying device for multiplying the (N) bit nodes by a parity-check-code matrix provided with (N) columns so as to obtain a plurality of check nodes;
    a reliability generator for generating a reliability index for each of the bit nodes in accordance with the channel;
    a reliability-updating device coupled to said verifying device and said reliability generator for using the bit nodes and the check nodes to exchange messages iteratively based on the reliability indices, and following each iteration, updating (N) exchange results corresponding to the (N) columns, respectively; and
    a recording controller coupled to said reliability-updating device, and including
        a separator for dividing the parity-check-code matrix into a number (G) of column groups according to column weights of the (N) columns, wherein $G \geq 1$, and outputting (N) characterizing signals corresponding to the exchange results, respectively, based on the column weights of each of the column groups, wherein the column weights of the columns belonging to a same column group have a same value, and the characterizing signals of the same column group are expressed using a same bit length,
        a quantizing determiner coupled to said separator for determining a shift signal for each of the column groups according to the characterizing signals, and
        a quantizer coupled to said quantizing determiner for quantizing the characterizing signals according to the shift signals for subsequent output.

2. The parity-check-code decoder as claimed in claim 1, wherein said quantizing determiner includes:
    (G) saturation counters, each corresponding to a respective one of the column groups, for determining whether the characterizing signals of the respective column group reach saturation, and outputting a saturation count accordingly; and
    (G) shift determiners coupled to said (G) saturation counters, each corresponding to a respective one of the column groups, for determining the shift signals in accordance with the saturation counts.

3. The parity-check-code decoder as claimed in claim 2, wherein each of said saturation counters includes:
    a saturation register unit for resetting the saturation count following each update of the exchange results by said reliability-updating device;
    a determining unit for determining whether the characterizing signals of the respective column group reach saturation;
    a multiplexing unit coupled to said determining unit for outputting a specific value according to a determination result of said determining unit; and
    an adder unit coupled to said multiplexing unit and said saturation register unit for adding the specific value to a previous saturation count and providing an addition result to said saturation register unit for subsequent output of an updated saturation count.

4. The parity-check-code decoder as claimed in claim 2, wherein each of said shift determiners includes:
    a shift register unit for resetting the shift signal to a predetermined value in accordance with generation of the reliability indices by said reliability generator,
    a determining unit for determining whether the saturation count is greater than a threshold value;
    a multiplexing unit coupled to said determining unit for outputting an accumulation signal according to a determination result of said determining unit; and
    a shift statistic unit coupled to said multiplexing unit and said shift register unit for multiplying a value of the accumulation signal by a value of a previous shift signal and providing a multiplication result to said shift register unit for subsequent output of an updated shift signal.

5. The parity-check-code decoder as claimed in claim 1, wherein said separator separates each of the characterizing signals into a sign indicator for indicating a sign and an absolute value signal for indicating an absolute value, said quantizing determiner determining the shift signal for each of the column groups in accordance with the absolute value signals of each of the column groups.

6. The parity-check-code decoder as claimed in claim 1, wherein said reliability-updating device updates the reliability indices for each updated exchange result of each iteration.

7. The parity-check-code decoder as claimed in claim 1, wherein said reliability-updating device updates at least one check index for each updated exchange result of each iteration.

8. The parity-check-code decoder as claimed in claim 2, wherein each of the shift signals generated by said (G) shift determiners has a form of 2 raised by a power, said quantizer dividing the characterizing signals belonging to the same column group by the corresponding shift signal.

9. The parity-check-code decoder as claimed in claim 2, wherein each of the shift signals generated by said (G) shift determiners has a form of a number raised by a power, said quantizer dividing the characterizing signals belonging to the same column group by $2^x$, wherein (x) equals the value of the corresponding shift signal.

10. The parity-check-code decoder as claimed in claim 4, wherein said shift register unit adjusts the predetermined value of the shift signal according to the channel.

11. A recording controller adapted for receiving at least (N) signals that are to be recorded, and for performing control based on a matrix provided with (N) columns, the signals comprising exchange results, said recording controller comprising:
    a separator for dividing the matrix into a number (G) of column groups according to column weights of the (N) columns, wherein $G \geq 1$, and outputting (N) characterizing signals corresponding to the exchange results, respectively, based on the column weights of each of the column groups, wherein the column weights of the columns belonging to a same column group have a same value, and the characterizing signals of the same column group are expressed using a same bit length;

a quantizing determiner coupled to said separator for determining a shift signal for each of the column groups according to the characterizing signals; and a quantizer coupled to said quantizing determiner for quantizing the characterizing signals according to the shift signals for subsequent writing to a memory.

12. The recording controller as claimed in claim 11, wherein said quantizing determiner includes:

(G) saturation counters, each corresponding to a respective one of the column groups, for determining whether the characterizing signals of the respective column group reach saturation, and outputting a saturation count accordingly; and (G) shift determiners coupled to said (G) saturation counters, each corresponding to a respective one of the column groups, for determining the shift signals in accordance with the saturation counts.

13. The recording controller as claimed in claim 12, wherein each of said saturation counters includes:

a saturation register unit for resetting the saturation count following each update of the exchange results;

a determining unit for determining whether the characterizing signals of the respective column group reach saturation;

a multiplexing unit coupled to said determining unit for outputting a specific value according to a determination result of said determining unit; and an adder unit coupled to said multiplexing unit and said saturation register unit for adding the specific value to a previous saturation count and providing an addition result to said saturation register unit for subsequent output of an updated saturation count.

14. The recording controller as claimed in claim 12, wherein the signals further comprise reliability indices, and each of said shift determiners includes:

a shift register unit for resetting the shift signal to a predetermined value upon receipt of the reliability indices by said recording controller;

a determining unit for determining whether the saturation count is greater than a threshold value;

a multiplexing unit coupled to said determining unit for outputting an accumulation signal according to a determination result of said determining unit; and a shift statistic unit coupled to said multiplexing unit and said shift register unit for multiplying a value of the accumulation signal by a value of a previous shift signal and providing a multiplication result to said shift register unit for subsequent output of an updated shift signal.

15. The recording controller as claimed in claim 11, wherein said separator separates each of the characterizing signals into a sign indicator for indicating a sign and an absolute value signal for indicating an absolute value, said quantizing determiner determining the shift signal for each of the column groups in accordance with the absolute value signals of each of the column groups.

16. The recording controller as claimed in claim 12, wherein each of the shift signals generated by said (G) shift determiners has a form of 2 raised by a power, said quantizer dividing the characterizing signals belonging to the same column group by the corresponding shift signal.

17. The recording controller as claimed in claim 12, wherein each of the shift signals generated by said (G) shift determiners has a form of a number raised by a power, said quantizer dividing the characterizing signals belonging to the same column group by $2^x$, wherein (x) equals the value of the corresponding shift signal.

18. The recording controller as claimed in claim 14, wherein said shift register unit is configured to reset the shift signal to the predetermined value that is adjustable according to a channel through which the (N) signals are received.

* * * * *